United States Patent
Matsumoto

(10) Patent No.: US 7,355,432 B2
(45) Date of Patent: Apr. 8, 2008

(54) BUFFER CIRCUIT, DRIVER CIRCUIT, AND SEMICONDUCTOR TESTING APPARATUS

(75) Inventor: Naoki Matsumoto, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/447,666

(22) Filed: Jun. 6, 2006

(65) Prior Publication Data

US 2006/0273832 A1    Dec. 7, 2006

Related U.S. Application Data

(63) Continuation of application No. PCT/JP2004/018214, filed on Dec. 7, 2004.

(30) Foreign Application Priority Data

Dec. 9, 2003   (JP)   .............................. 2003-410115

(51) Int. Cl.
*G01R 31/26* (2006.01)
*G01R 31/28* (2006.01)
*H03B 1/00* (2006.01)

(52) U.S. Cl. .................. 324/765; 324/158.1; 327/108

(58) Field of Classification Search ........ 327/108–112, 327/494, 496, 478; 324/765, 158.1
See application file for complete search history.

(56) References Cited

U.S. PATENT DOCUMENTS

| 5,654,655 A | 8/1997 | Awaji et al. |
| 5,699,001 A | 12/1997 | Awaji et al. |
| 6,275,023 B1 * | 8/2001 | Oosaki et al. ............ 324/158.1 |

FOREIGN PATENT DOCUMENTS

JP    9-321607    12/1997

OTHER PUBLICATIONS

International Search Report issued for PCT/JP2004/018214 mailed on Mar. 29, 2005 and English translation thereof, 2 pages.

* cited by examiner

*Primary Examiner*—Ha Tran Nguyen
*Assistant Examiner*—Roberto Velez
(74) *Attorney, Agent, or Firm*—Osha Liang LLP

(57) ABSTRACT

There is provided a buffer circuit that can deal with input and output signals having a large voltage swing. Such a buffer circuit is designed for outputting an output signal corresponding to an input signal. The buffer circuit includes an input/output circuit for maintaining an output impedance at a constant level, and outputting the output signal having an output voltage which is substantially the same as the input voltage of the input signal, the transistors 434 and 424 that are connected to the respective ends of the input/output circuit in series, where the transistors 434 and 424 protect the input/output circuit by reducing power consumption of the input/output circuit in such a manner as to supply voltages that correspond to the input voltage or the output voltage in terms of level, to the respective ends of the input/output circuit, and the control circuit 420 for (i) when the input voltage is smaller than a reference level, supplying a predetermined constant voltage to the transistor 434 as the base voltage, and (ii) when the input voltage is equal to or larger than the reference level, supplying a voltage that is obtained by decreasing the input voltage by a predetermined voltage to the transistor 434 as the base voltage. Here, the decreased voltage is larger than the predetermined constant voltage.

12 Claims, 8 Drawing Sheets

US 7,355,432 B2

BUFFER CIRCUIT, DRIVER CIRCUIT, AND SEMICONDUCTOR TESTING APPARATUS

CROSS REFERENCE TO RELATED APPLICATION

This is a continuation application of PCT/JP2004/018214 filed on Dec. 7, 2004 which claims priority from a Japanese Patent Application(s) No. 2003-410115 filed on Dec. 9, 2003, the contents of which are incorporated herein by reference.

BACKGROUND OF THE INVENTION

1. Field of the Invention

The present invention relates to a buffer circuit, a driver circuit, and a semiconductor testing apparatus. The present invention specifically relates to a buffer circuit and a driver circuit that can deal with input and output signals with a large voltage swing, and a semiconductor testing apparatus including such a driver.

2. Related Art

FIG. 1 shows the configuration of a conventional buffer circuit 100. The buffer circuit 100 includes an input terminal 101, a transistor 102, a schottky diode 104, a constant current source 106, a constant current source 108, a schottky diode 110, a transistor 112, a transistor 114, a schottky diode 116, a schottky diode 118, a transistor 120, and an output terminal 122.

The transistor 102 is an NPN transistor. The base electrode of the transistor 102 is connected to the input terminal 101, the collector electrode is connected to a positive power supply voltage (Vcc), and the emitter electrode is connected to the anode of the schottky diode 104. The schottky diode 104 is connected at the anode to the emitter electrode of the transistor 102, and connected at the cathode to the base electrode of the transistor 120 and the constant current source 106. The constant current source 106 is connected to the cathode of the schottky diode 104 and a negative power supply voltage (Vee) so as to be positioned therebetween. The constant current source 106 causes a constant current to flow, between the positive power supply voltage and the negative power supply voltage, into the transistor 102 and the schottky diode 104.

The transistor 112 is a PNP transistor. The base electrode of the transistor 112 is connected to the input terminal 101, the collector electrode is connected to the negative power supply voltage, and the emitter electrode is connected to the cathode of the schottky diode 110. The schottky diode 110 is connected at the anode to the constant current source 108, and connected at the cathode to the emitter electrode of the transistor 112. The constant current source 108 is connected to the positive power supply voltage and the anode of the schottky diode 110 so as to be positioned therebetween. The constant current source 108 causes a constant current to flow, between the positive power supply voltage and the negative power supply voltage, into the schottky diode 110 and the transistor 112.

The transistor 114 is an NPN transistor. The base electrode of the transistor 114 is connected to the constant current source 108 and the anode of the schottky diode 110, the collector electrode is connected to the positive power supply voltage, and the emitter electrode is connected to the schottky diode 116. The schottky diode 116 is connected at the anode to the emitter electrode of the transistor 114, and connected at the cathode to the output terminal 122. The schottky diode 118 is connected at the anode to the output terminal 122, and connected at the cathode to the emitter electrode of the transistor 120. The transistor 120 is a PNP transistor. The base electrode of the transistor 120 is connected to the constant current source 106 and the cathode of the schottky diode 104, the emitter electrode is connected to the cathode of the schottky diode 118, and the collector electrode is connected to the negative power supply voltage. Here, the currents supplied from the constant current sources 106 and 108 are substantially the same. According to this construction, the transistor 114, the schottky diode 116, the schottky diode 118, and the transistor 120 are supplied with a constant current all the time.

Here, it is assumed that in the above-described buffer circuit 100, the positive power supply voltage is +19 V, the negative power supply voltage is −6.5 V, and the input signal (input) and the output signal (output) have a voltage in a range from −3 V to +15 V. When a voltage decrease due to the transistors is 0.8 V, and a voltage decrease due to the schottky diodes is 0.5 V, the base voltage of the transistor 114 ranges from −1.7 V to +16.3 V, and the base voltage of the transistor 120 ranges from −4.3 V to +13.7 V.

FIG. 2 shows the configuration of a conventional buffer circuit 200. The buffer circuit 200 includes an input terminal 201, a transistor 202, a schottky diode 204, a resistance 206, a schottky diode 208, a constant current source 210, a constant current source 212, a schottky diode 214, a resistance 216, a schottky diode 218, a transistor 220, a transistor 222, a transistor 224, a schottky diode 226, a schottky diode 228, a transistor 230, a transistor 232, and an output terminal 234.

The transistor 202 is an NPN transistor. The base electrode of the transistor 202 is connected to the input terminal 201, the collector electrode is connected to a positive power supply voltage (Vcc), and the emitter electrode is connected to the anode of the schottky diode 204. The schottky diode 204 is connected at the anode to the emitter electrode of the transistor 202, and connected at the cathode to the base electrode of the transistor 230 and the resistance 206. The resistance 206 is connected to the cathode of the schottky diode 204 and the anode of the schottky diode 208 so as to be positioned therebetween. The schottky diode 208 is connected at the anode to the resistance 206, and connected at the cathode to the base electrode of the transistor 232 and the constant current source 210. The constant current source 210 is connected to the cathode of the schottky diode 208 and a negative power supply voltage (Vee) so as to be positioned therebetween. The constant current source 210 causes a constant current to flow, between the positive power supply voltage and the negative power supply voltage, into the transistor 202, the schottky diode 204, the resistance 206 and the schottky diode 208.

The transistor 220 is a PNP transistor. The base electrode of the transistor 220 is connected to the input terminal 201, the collector electrode is connected to the negative power supply voltage, and the emitter electrode is connected to the cathode of the schottky diode 218. The schottky diode 218 is connected at the cathode to the emitter electrode of the transistor 220, and connected at the anode to the base electrode of the transistor 224 and the resistance 216. The resistance 216 is connected to the cathode of the schottky diode 214 and the anode of the schottky diode 218 so as to be positioned therebetween. The schottky diode 214 is connected at the cathode to the resistance 216, and connected at the anode to the base electrode of the transistor 222 and the constant current source 212. The constant current source 212 is connected to the anode of the schottky diode 214 and the positive power supply voltage so as to be positioned therebetween. The constant current source 212 causes a constant current to flow, between the positive power supply voltage and the negative power supply voltage, into the schottky diode 214, the resistance 216, the schottky diode 218, and the transistor 220.

The transistor 222 is an NPN transistor. The base electrode of the transistor 222 is connected to the constant current source 212 and the anode of the schottky diode 214, the collector electrode is connected to the positive power supply voltage, and the emitter electrode is connected to the collector electrode of the transistor 224. The transistor 224 is an NPN transistor. The base electrode of the transistor 224 is connected to the resistance 216 and the anode of the schottky diode 218, the collector electrode is connected to the emitter electrode of the transistor 222, and the emitter electrode is connected to the anode of the schottky diode 226. The schottky diode 226 is connected at the anode to the emitter electrode of the transistor 224, and connected at the cathode to the output terminal 234 and the anode of the schottky diode 228. The schottky diode 228 is connected at the anode to the cathode of the schottky diode 226 and the output terminal 234, and connected at the cathode to the emitter electrode of the transistor 230. The transistor 230 is a PNP transistor. The base electrode of the transistor 230 is connected to the cathode of the schottky diode 204 and the resistance 206, the emitter electrode is connected to the cathode of the schottky diode 228, and the collector electrode is connected to the emitter electrode of the transistor 232. The transistor 232 is a PNP transistor. The base electrode of the transistor 232 is connected to the cathode of the schottky diode 208 and the constant current source 210, the emitter electrode is connected to the collector electrode of the transistor 230, and the collector electrode is connected to the negative power supply voltage. Here, the currents supplied from the constant current sources 210 and 212 are substantially the same. According to this construction, the transistor 222, the transistor 224, the schottky diode 226, the schottky diode 228, the transistor 230 and the transistor 232 are supplied with a constant current all the time.

Here, it is assumed that in the above-described buffer circuit 200, the positive power supply voltage is +19 V, the negative power supply voltage is −6.5 V, and the input signal (input) and the output signal (output) have a voltage in a range from −3 V to +15 V. When a voltage decrease due to the transistors is 0.8 V, and a voltage decrease due to the schottky diodes is 0.5 V, the base voltage of the transistor 224 ranges from −1.7 V to +16.3 V, the base voltage of the transistor 230 ranges from −4.3 V to +13.7 V, the base voltage of the transistor 222 ranges from −0.9 V to +17.1 V, and the base voltage of the transistor 232 ranges from −5.1 V to +12.9 V.

Since no prior art documents related to the present invention have been found, the explanation regarding such documents will be omitted.

Recent development of a higher-speed semiconductor device has created a demand for a higher-speed buffer circuit to be used in a driver circuit that is included in a semiconductor testing apparatus and supplies a test signal for testing the semiconductor device. Since such a buffer circuit has been increasingly formed by a chip, it is difficult to increase the permissible voltage level of the base voltages of the transistors used in the buffer circuit in addition to realization of higher-speed configuration.

In the buffer circuit 100 shown in FIG. 1, the voltage swing of the input signal is directly reflected in the base voltages of the transistors 114 and 120. This makes it impossible to increase the voltage swing of the input signal. Accordingly, the buffer circuit 100 can not output an output signal having a large voltage swing. The buffer circuit 200 shown in FIG. 2 additionally has a tracking circuit, and thus can maintain the base voltages of the transistors 224 and 230 at a constant level. However, the voltage swing of the input signal is directly reflected in the base voltages of the transistors 222 and 232. This makes it impossible to increase the voltage swing of the input signal. As a result, the buffer circuit 200 can not output an output signal having a large voltage swing.

SUMMARY OF THE INVENTION

It is an object of the present invention to provide a buffer circuit, a driver circuit, and a semiconductor testing apparatus that can solve the above-described problems. This object is achieved by combining the features recited in the independent claims. The dependent claims define further effective specific example of the present invention.

A first embodiment of the present invention provides a buffer circuit for outputting an output signal corresponding to an input signal. The buffer circuit includes an input/output circuit for maintaining an output impedance at a constant level, and outputting the output signal having an output voltage which is substantially same as an input voltage of the input signal, a first transistor and a second transistor that are connected to respective ends of the input/output circuit in series, wherein the first and second transistors protect the input/output circuit by reducing power consumption of the input/output circuit in such a manner as to supply voltages that correspond to the input voltage or the output voltage in terms of level, to the respective ends of the input/output circuit, and a first control circuit for (i) when the input voltage is smaller than a first reference level, supplying a predetermined constant voltage to the first transistor as a base voltage thereof, and (ii) when the input voltage is equal to or larger than the first reference level, supplying a voltage that is obtained by decreasing the input voltage by a first predetermined voltage to the first transistor as the base voltage. Here, the decreased voltage is larger than the predetermined constant voltage.

The input/output circuit may include an input terminal for receiving the input signal, an output terminal for outputting the output signal, a third transistor whose base electrode is connected to the input terminal, and whose collector electrode is connected to a positive power supply voltage, wherein the third transistor is an NPN transistor, a first diode whose anode is connected to an emitter electrode of the third transistor, a first constant current source that is connected to a cathode of the first diode, wherein the first constant current source supplies a constant current to the third transistor and the first diode, a fourth transistor whose base electrode is connected to the input terminal, and whose collector electrode is connected to a negative power supply voltage, wherein the fourth transistor is a PNP transistor, a second diode whose cathode is connected to an emitter electrode of the fourth transistor, and a second constant current source that is connected to an anode of the second diode, wherein the second constant current source supplies a constant current to the fourth transistor and the second diode.

The input/output circuit may further include a fifth transistor whose base electrode is connected to the cathode of the first diode, and whose collector electrode is connected to an emitter electrode of the first transistor, wherein the fifth transistor is a PNP transistor, a third diode whose anode is connected to the output terminal, and whose cathode is connected to an emitter electrode of the fifth transistor, a sixth transistor whose base electrode is connected to the anode of the second diode, and whose collector electrode is connected to an emitter electrode of the second transistor, wherein the sixth transistor is an NPN transistor, and a fourth diode whose anode is connected to an emitter electrode of the sixth transistor, and whose cathode is connected to the output terminal.

The first transistor may be a PNP transistor, and a collector electrode and an emitter electrode of the first transistor may be respectively connected to a negative power supply voltage and the input/output circuit. The second transistor may be an NPN transistor, and a collector electrode and an emitter electrode of the second transistor may be respectively connected to a positive power supply voltage and the input/output circuit.

The first control circuit may include a first constant voltage source for, when the input voltage is smaller than the first reference level, supplying the predetermined constant voltage to the first transistor as the base voltage thereof.

The first control circuit may include a seventh transistor whose base electrode is supplied with the input signal, wherein the seventh transistor is a PNP transistor, a fifth diode whose cathode is connected to an emitter electrode of the seventh transistor, a first voltage decreasing circuit for decreasing a positive power supply voltage and supplying the decreased voltage to an anode of the fifth diode, a third constant current source that is connected to the positive power supply voltage and the first voltage decreasing circuit so as to be positioned therebetween, wherein the third constant current source supplies a constant current to the first voltage decreasing circuit, the fifth diode, and the seventh transistor, an eighth transistor whose base electrode is supplied with the input signal, wherein the eighth transistor is an NPN transistor, a sixth diode whose anode is connected to an emitter electrode of the eighth transistor, a second voltage decreasing circuit that is connected to a cathode of the sixth diode, wherein the second voltage decreasing circuit supplies the voltage obtained by decreasing the input voltage by the first predetermined voltage, to the first transistor as the base voltage and the decreased voltage is larger than the predetermined constant voltage, and a fourth constant current source that is connected to the second voltage decreasing circuit and a negative power supply voltage so as to be positioned therebetween, wherein the fourth constant current source supplies a constant current to the eighth transistor, the sixth diode, and the second voltage decreasing circuit.

The buffer circuit may further include a second control circuit for (i) when the input voltage is larger than a second reference level, supplying a predetermined constant voltage to the second transistor as a base voltage thereof, and (ii) when the input voltage is equal to or smaller than the second reference level, supplying a voltage obtained by increasing the input voltage by a second predetermined voltage, to the second transistor as the base voltage, wherein the increased voltage is smaller than the predetermined constant voltage.

The second control circuit may include a second constant voltage source for, when the input voltage is larger than the second reference level, supplying the predetermined constant voltage to the second transistor as the base voltage.

The second control circuit may include a ninth transistor whose base electrode is supplied with the input signal, wherein the ninth transistor is an NPN transistor, a seventh diode whose anode is connected to an emitter electrode of the ninth transistor, a third voltage decreasing circuit for increasing a negative power supply voltage and supplying the increased voltage to a cathode of the seventh diode, a fifth constant current source that is connected to the negative power supply voltage and the third voltage decreasing circuit so as to be positioned therebetween, wherein the fifth constant current source supplies a constant current to the third voltage decreasing circuit, the seventh diode, and the ninth transistor, a tenth transistor whose base electrode is supplied with the input signal, wherein the tenth transistor is a PNP transistor, an eighth diode whose cathode is connected to an emitter electrode of the tenth transistor, a fourth voltage decreasing circuit that is connected to an anode of the eighth diode, wherein the fourth voltage decreasing circuit supplies the voltage obtained by increasing the input voltage by the second predetermined voltage, to the second transistor as the base voltage and the increased voltage is smaller than the predetermined constant voltage, and a sixth constant current source that is connected to the fourth voltage decreasing circuit and a positive power supply voltage so as to be positioned therebetween, wherein the sixth constant current source supplies a constant current to the tenth transistor, the eighth diode, and the fourth voltage decreasing circuit.

A second embodiment of the present invention provides a buffer circuit for outputting an output signal corresponding to an input signal. The buffer circuit includes an input/output circuit for maintaining an output impedance at a constant level, and outputting the output signal having an output voltage which is substantially same as an input voltage of the input signal, a first transistor and a second transistor that are connected to respective ends of the input/output circuit in series, wherein the first and second transistors protect the input/output circuit by reducing power consumption of the input/output circuit in such a manner as to supply voltages that correspond to the input voltage or the output voltage in terms of level, to the respective ends, and a second control circuit for (i) when the input voltage is larger than a second reference level, supplying a predetermined constant voltage to the second transistor as a base voltage thereof, and (ii) when the input voltage is equal to or smaller than the second reference level, supplying a voltage obtained by increasing the input voltage by a second predetermined voltage to the second transistor as the base voltage, wherein the increased voltage is smaller than the predetermined constant voltage.

A third embodiment of the present invention provides a driver circuit for supplying a test signal to a semiconductor device. The driver circuit includes an input/output circuit for maintaining an output impedance at a constant level, and supplying the test signal which has an output voltage substantially same as an input voltage of an input test signal, to the semiconductor device, a first transistor and a second transistor that are connected to respective ends of the input/output circuit in series, wherein the first and second transistors protect the input/output circuit by reducing power consumption of the input/output circuit in such a manner as to supply voltages that correspond to the input voltage or the output voltage in terms of level, to the respective ends, and a first control circuit for (i) when the input voltage is smaller than a first reference level, supplying a predetermined constant voltage to the first transistor as a base voltage thereof, and (ii) when the input voltage is equal to or larger than the first reference level, supplying a voltage obtained by decreasing the input voltage by a first predetermined voltage, to the first transistor as the base voltage, wherein the decreased voltage is larger than the predetermined constant voltage.

A fourth embodiment of the present invention provides a semiconductor testing apparatus for testing a semiconductor device. The semiconductor testing apparatus includes a pattern generating section for generating a test signal to be input into the semiconductor device, a driver circuit for supplying the test signal to the semiconductor device, a comparator circuit for comparing a test signal output from the semiconductor device with a threshold voltage, and a judging section for judging whether the semiconductor device is good or bad based on a result of the comparison done by the comparator circuit. Here, the driver circuit includes an input/output circuit for maintaining an output impedance at a constant level, and supplying a test signal having an output voltage which is substantially same as an input voltage of the test signal, to the semiconductor device, a first transistor and a second transistor that are connected to respective ends of the input/output circuit in series, wherein the first and second transistors protect the input/output circuit by reducing power consumption of the input/output circuit in such a manner as to supply voltages that correspond to the input voltage or the output voltage in terms of level, to the respective ends of the input/output circuit, and a first control circuit for (i) when the input voltage is smaller than a first reference level, supplying a predetermined constant voltage to the first transistor as a base voltage thereof, and (ii) when the input voltage is equal to or larger than the first reference level, supplying a voltage that is obtained by decreasing the input voltage by a first predetermined voltage to the first transistor as the base voltage, wherein the decreased voltage is larger than the predetermined constant voltage.

Here, all the necessary features of the present invention are not listed in the summary of the invention. The sub-combinations of the features may become the invention.

The present invention can provide a buffer circuit and a driver circuit that can deal with input and output signals having a large voltage swing, and a semiconductor testing apparatus including such a driver.

DETAILED DESCRIPTION OF THE INVENTION

Hereinafter, the present invention will now be described through preferred embodiments. The embodiments do not limit the invention according to claims and all the combinations of the features described in the embodiments are not necessarily essential to means for solving the problems of the invention.

Figure 1:
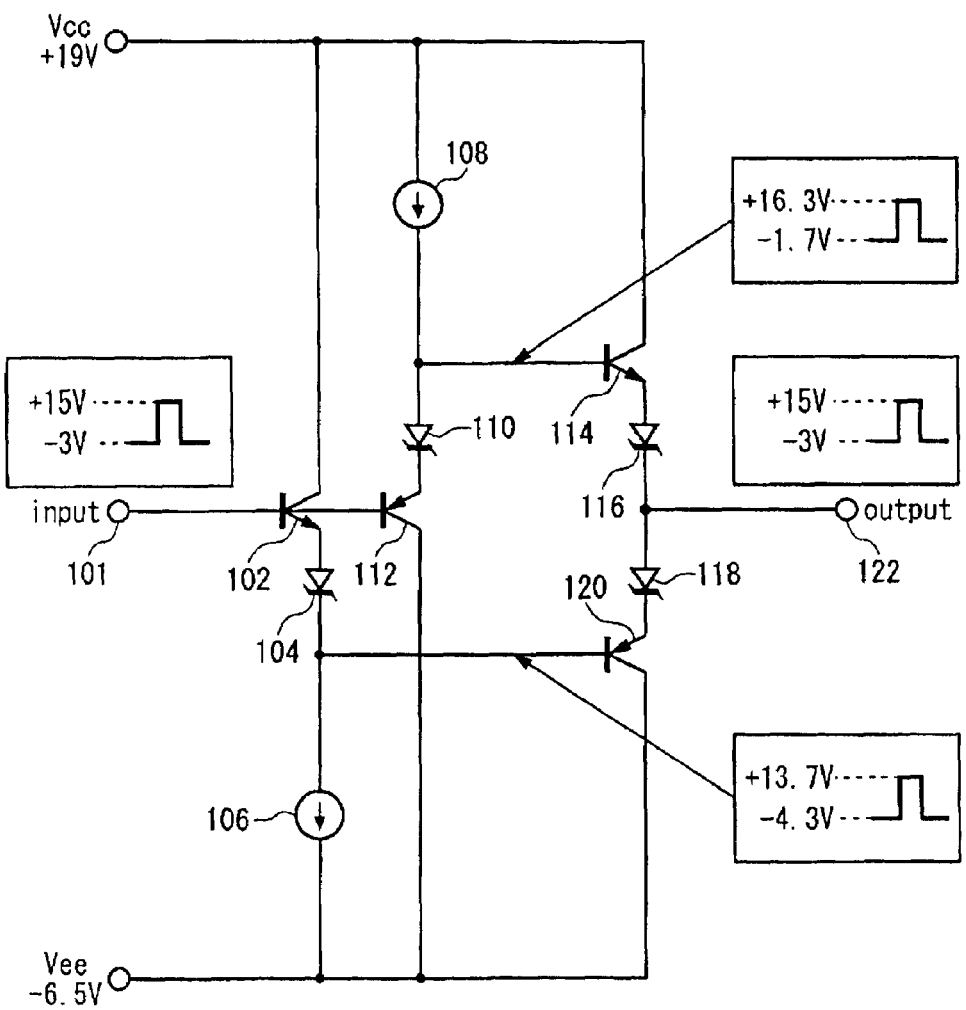
FIG. 1 shows the configuration of a conventional buffer circuit 100.
Figure 2:
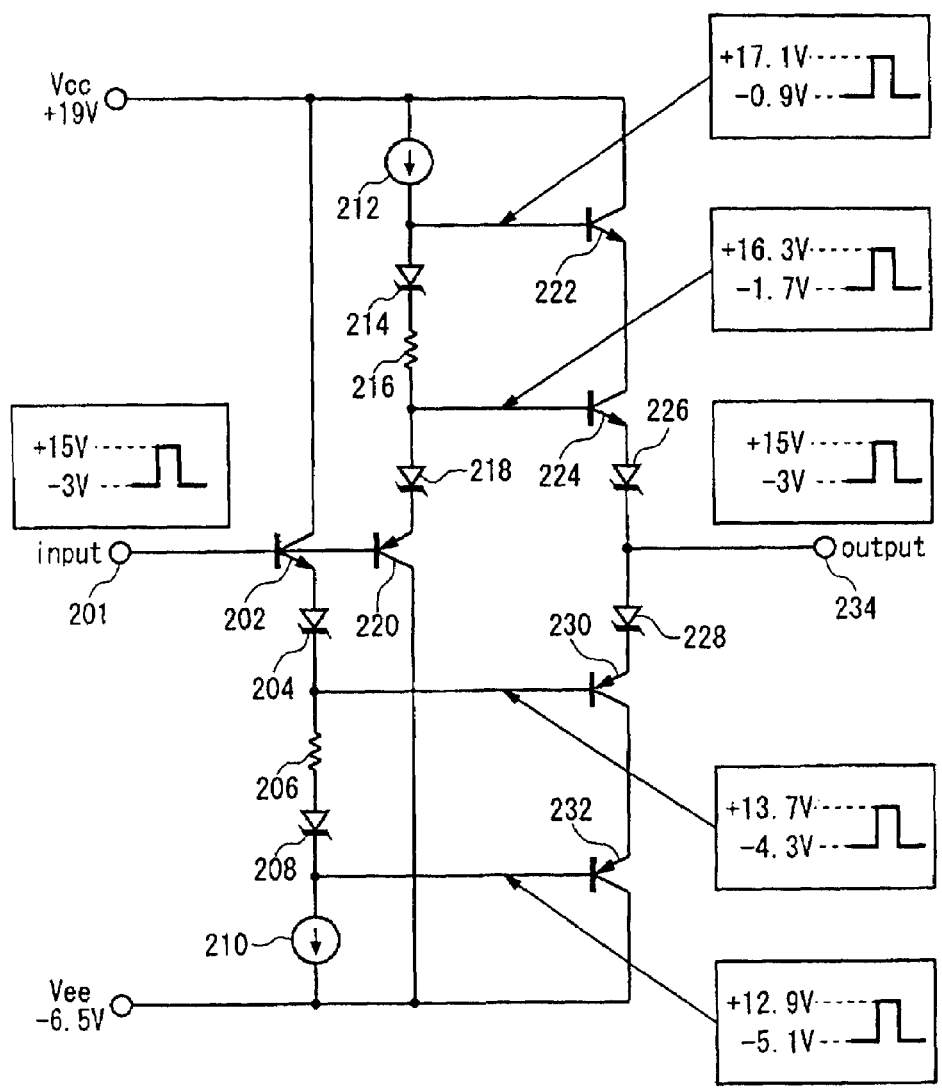
FIG. 2 shows the configuration of a conventional buffer circuit 200.
Figure 3:
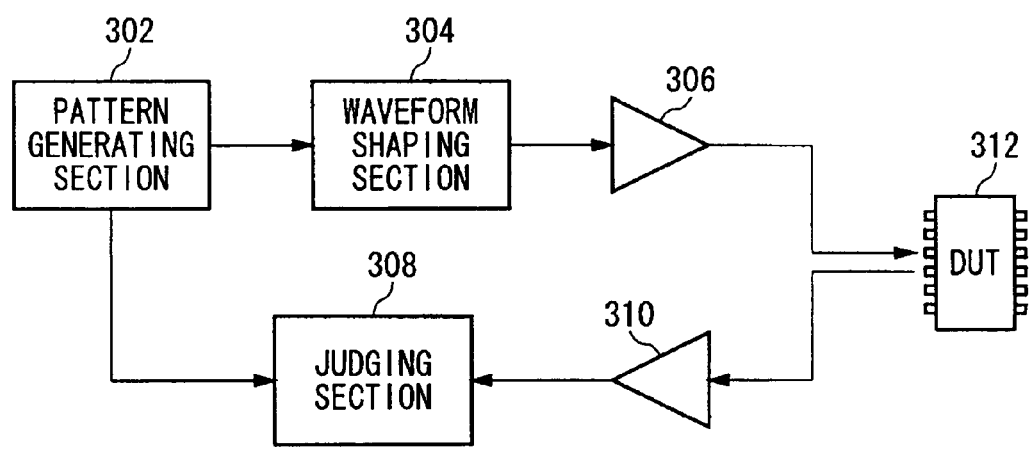
FIG. 3 shows an example of the configuration of a semiconductor testing apparatus 300.

FIG. 3 shows an example of the configuration of a semiconductor testing apparatus 300 in accordance with one embodiment of the present invention. The semiconductor testing apparatus 300 includes a pattern generating section 302, a waveform shaping section 304, a driver circuit 306, a judging section 308, and a comparator circuit 310. The pattern generating section 302 generates a test signal to be input into a semiconductor device (device under test: DUT) 312, and supplies the generated test signal to the waveform shaping section 304. The pattern generating section 302 also generates an expected value signal corresponding to the test signal to be input into the semiconductor device 312, and supplies the expected value signal to the judging section 308. The waveform shaping section 304 shapes the test signal supplied from the pattern generating section 302. The driver circuit 306 supplies the test signal shaped by the waveform shaping section 304, to the semiconductor device 312. The comparator circuit 310 compares the test signal output from the semiconductor device 312 with a threshold voltage, and supplies the result of the comparison to the judging section 308. The judging section 308 compares the comparison result supplied from the comparator circuit 310 with the expected value signal supplied from the pattern generating section 302, to judge whether the semiconductor device 312 is good or bad.

In the semiconductor testing apparatus 300 in accordance with the present embodiment, the driver circuit 306 has a tracking circuit. This enables the semiconductor testing apparatus 300 to deal with a test signal with a large voltage swing. For this reason, the semiconductor device 312 tested by the semiconductor testing apparatus 300 can include semiconductor devices with various characteristics.

Figure 4:
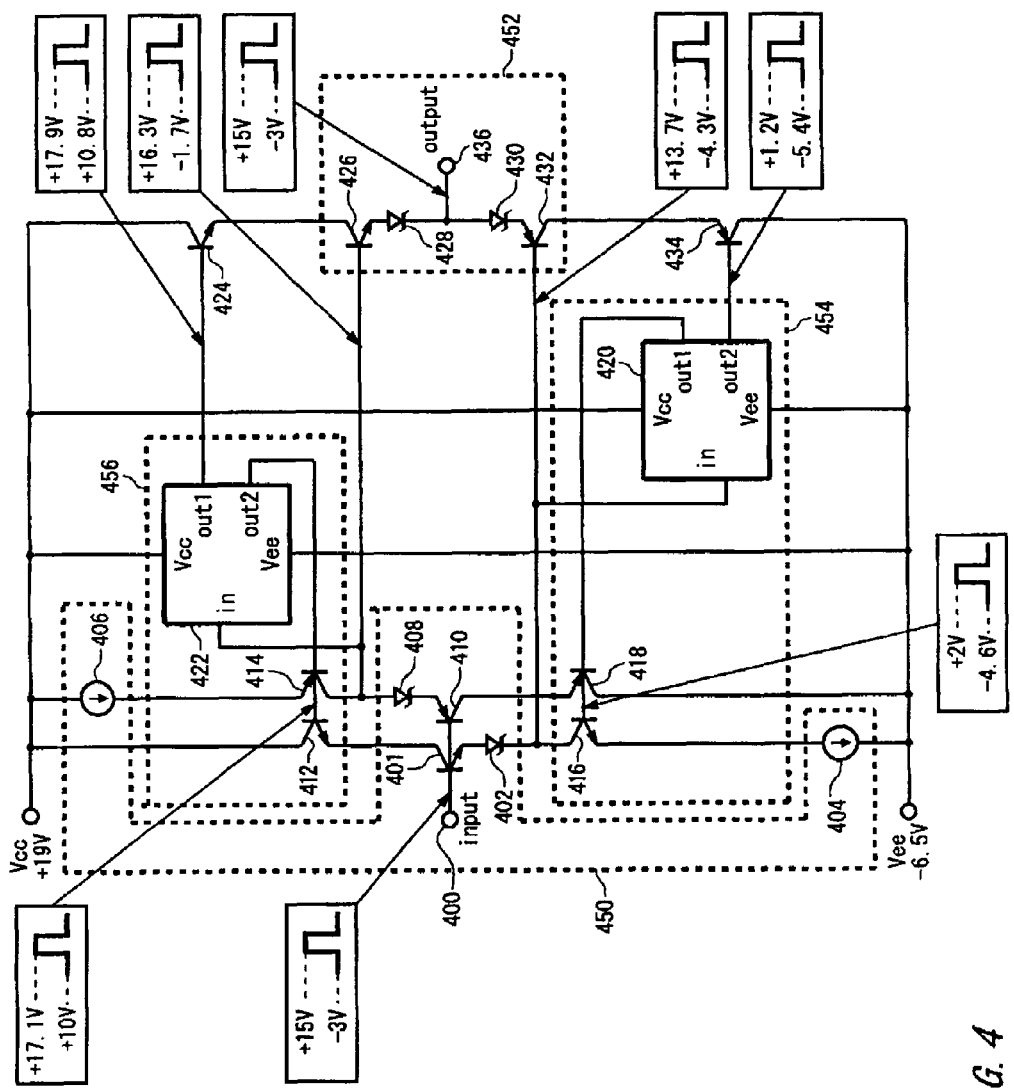
FIG. 4 shows an example of the configuration of a driver circuit 306.

FIG. 4 shows an example of the configuration of the driver circuit 306 in accordance with the present embodiment. The driver circuit 306 includes an input terminal 400, a transistor 401, a schottky diode 402, a constant current source 404, a constant current source 406, a schottky diode 408, a transistor 410, a transistor 412, a transistor 414, a transistor 416, a transistor 418, a control circuit 420, a control circuit 422, a transistor 424, a transistor 426, a schottky diode 428, a schottky diode 430, a transistor 432, a transistor 434, and an output terminal 436. Here, the driver circuit 306 is illustrative of the buffer circuit in accordance with the present invention. A schottky diode serves as an example of the diode in accordance with the present invention. The present invention may use other types of diodes than schottky diodes for the diode.

The input terminal 400, the transistor 401, the schottky diode 402, the constant current source 404, the transistor 410, the schottky diode 408, the constant current source 406, the transistor 426, the schottky diode 428, the schottky diode 430, the transistor 432, and the output terminal 436 are example constituents of the input/output circuit in accordance with the present invention. These constituents maintain the output impedance at a constant level, and output, through the output terminal 436, an output signal (output) having a voltage substantially the same as the voltage of an input signal (input) that is input through the input terminal 400. The input/output circuit in accordance with the present invention may have a different circuit construction from the construction shown in FIG. 4.

The transistors 434 and 424 are respectively connected to the transistors 432 and 426 in series. The transistors 434 and 424 respectively supply voltages corresponding to the input voltage or output voltage to the transistors 432 and 426, so as to reduce their power consumption. In this manner, the transistors 432 and 426 are protected. Here, the transistors 432 and 426 are illustrative of the ends of the input/output circuit in accordance with the present invention.

When the input voltage is smaller than a first reference level, the control circuit 420 supplies a predetermined constant voltage to the transistor 434 as the base voltage. When the input voltage is equal to or larger than the first reference level, the control circuit 420 supplies a voltage obtained by decreasing the input voltage by a first predetermined voltage, to the transistor 434 as the base voltage. Here, the decreased voltage is larger than the predetermined constant voltage. When the input voltage is larger than a second reference level, the control circuit 422 supplies a predetermined constant voltage to the transistor 424 as the base voltage. When the input voltage is equal to or smaller than the second reference level, the control circuit 422 supplies a voltage obtained by increasing the input voltage by a second predetermined voltage, to the transistor 424 as the base voltage. Here, the increased voltage is smaller than the predetermined constant voltage.

The following specifically describes the circuit configuration. The transistor 401 is an NPN transistor. The base electrode of the transistor 401 is connected to the input terminal 400, the collector electrode is connected to the emitter electrode of the transistor 412 and a positive power supply voltage (Vcc) via the transistor 412, and the emitter electrode is connected to the anode of the schottky diode 402. The schottky diode 402 is connected at the anode to the emitter electrode of the transistor 401, and connected at the cathode to the collector electrode of the transistor 416 and the constant current source 404 via the transistor 416. The constant current source 404 is connected to the cathode of the schottky diode 402 via the transistor 416. The constant current source 404 is connected to the schottky diode 402 and a negative power supply voltage (Vee) so as to be positioned therebetween. The constant current source 404 causes a constant current to flow, between the positive power supply voltage and the negative power supply voltage, into the transistor 412, the transistor 401, the schottky diode 402, and the transistor 416.

The transistor 410 is a PNP transistor. The base electrode of the transistor 410 is connected to the input terminal 400, the collector electrode is connected to the emitter electrode of the transistor 418 and the negative power supply voltage via the transistor 418, and the emitter electrode is connected to the cathode of the schottky diode 408. The schottky diode 408 is connected at the cathode to the emitter electrode of the transistor 410, and connected at the anode to the collector electrode of the transistor 414 and the constant current source 406 via the transistor 414. The constant current source 406 is connected to the anode of the schottky diode 408 via the transistor 414. The constant current source 406 is connected to the schottky diode 408 and the positive power supply voltage so as to be positioned therebetween. The constant current source 406 causes a constant current to flow, between the positive power supply voltage and the negative power supply voltage, into the transistor 414, the schottky diode 408, the transistor 410, and the transistor 418.

The transistor 412 is an NPN transistor. The base electrode of the transistor 412 is connected to the output terminal (out 2) of the control circuit 422, the collector electrode is connected to the positive power supply voltage, and the emitter electrode is connected to the collector electrode of the transistor 401. The transistor 414 is a PNP transistor. The base electrode of the transistor 414 is supplied with the output terminal (out 2) of the control circuit 422, the emitter electrode is connected to the constant current source 406, and the collector electrode is connected to the anode of the schottky diode 408, the base electrode of the transistor 426, and the input terminal (in) of the control circuit 422. The transistor 416 is an NPN transistor. The base electrode of the transistor 416 is supplied with the output terminal (out 1) of the control circuit 420, the collector electrode is connected to the cathode of the schottky diode 402 and the base electrode of the transistor 432, and the emitter electrode is connected to the constant current source 404. The transistor 418 is a PNP transistor. The base electrode of the transistor 418 is supplied with the output terminal (out 1) of the control circuit 420, the emitter electrode is connected to the collector electrode of the transistor 410, and the collector electrode is connected to the negative power supply voltage.

The transistor 432 is a PNP transistor. The base electrode of the transistor 432 is connected to the cathode of the schottky diode 402 and the collector electrode of the transistor 416, the collector electrode is connected to the emitter electrode of the transistor 434, and the emitter electrode is connected to the cathode of the schottky diode 430. The schottky diode 430 is connected at the anode to the output terminal 436 and the cathode of the schottky diode 428, and connected at the cathode to the emitter electrode of the transistor 432. The transistor 426 is an NPN transistor. The base electrode of the transistor 426 is connected to the anode of the schottky diode 408 and the collector electrode of the transistor 414, the collector electrode is connected to the emitter electrode of the transistor 424, and the emitter electrode is connected to the anode of the schottky diode 428. The schottky diode 428 is connected at the anode to the emitter electrode of the transistor 426, and connected at the cathode to the output terminal 436 and the anode of the schottky diode 430.

The transistor 434 is a PNP transistor. The base electrode of the transistor 434 is connected to the output terminal (out 2) of the control circuit 420, the collector electrode is connected to the negative power supply voltage, and the emitter electrode is connected to the collector electrode of the transistor 432. The transistor 424 is an NPN transistor. The base electrode of the transistor 424 is connected to the output terminal (out 1) of the control circuit 422, the collector electrode is connected to the positive power supply voltage, and the emitter electrode is connected to the collector electrode of the transistor 426.

Here, the currents supplied from the constant current sources 404 and 406 are substantially the same. According to this construction, the transistor 424, the transistor 426, the schottky diode 428, the schottky diode 430, the transistor 432, and the transistor 434 are supplied with a constant current all the time, and the output impedance of the driver circuit 306 is maintained at a constant level. In addition, the base voltage is dispersed between the transistors 424, 426, 432 and 434. In this manner, the driver circuit 306 can deal with input and output signals having a large voltage swing, with the permissible level of the voltages supplied to the transistors 424, 426, 432 and 434 being satisfied.

Figure 5:
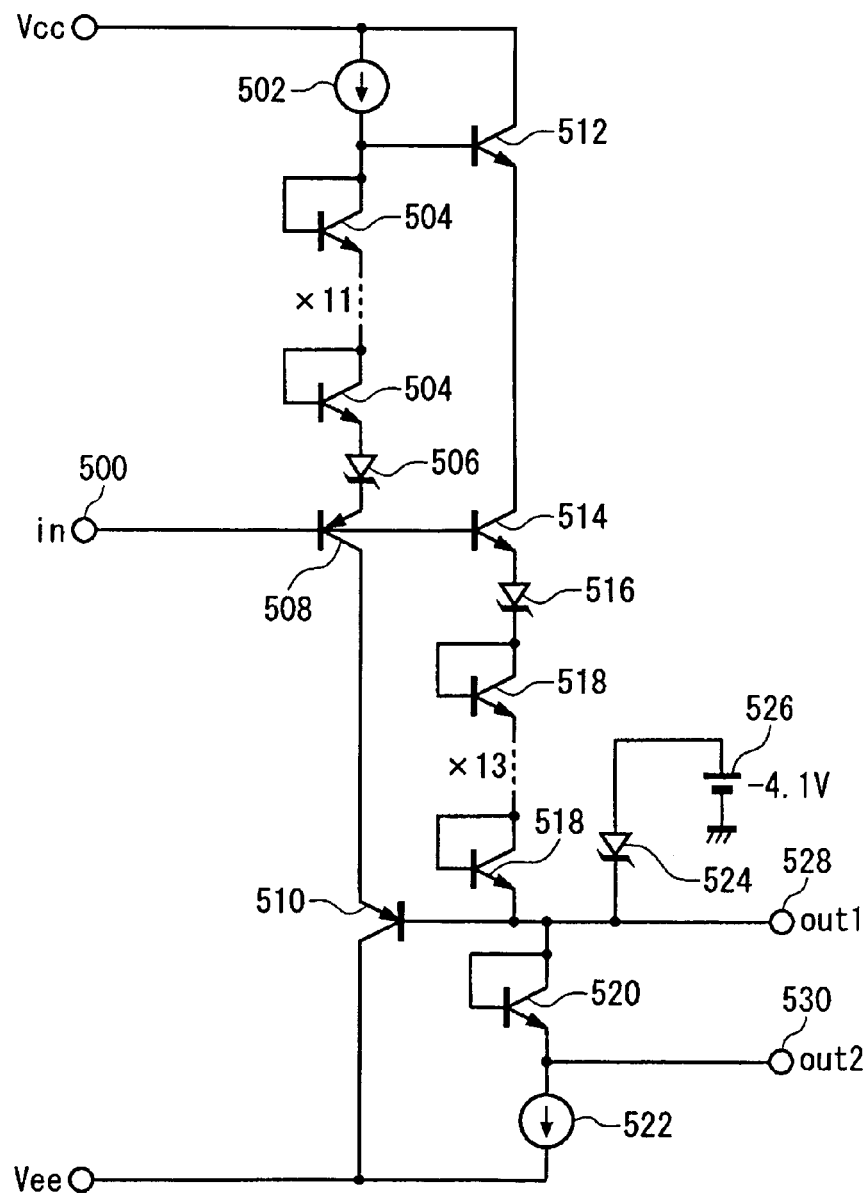
FIG. 5 shows an example of the configuration of a control circuit 420.

FIG. 5 shows an example of the configuration of the control circuit 420 in accordance with the present embodiment. The control circuit 420 includes an input terminal (in) 500, a constant current source 502, one or more transistors 504, a schottky diode 506, a transistor 508, a transistor 510, a transistor 512, a transistor 514, a schottky diode 516, one or more transistors 518, a transistor 520, a constant current source 522, a schottky diode 524, a constant voltage source 526, an output terminal (out 1) 528, and an output terminal (out 2) 530.

Here, the control circuit 420 is illustrative of the first control circuit in accordance with the present invention. The present invention may use other circuit configurations than the control circuit 420 to realize the first control circuit. The transistors 504 and 518 are illustrative of the voltage decreasing circuit in accordance with the present invention. The present invention may use other types of elements than transistors to realize the voltage decreasing circuit.

The transistor 508 is a PNP transistor. The base electrode of the transistor 508 is connected to the input terminal 500, the emitter electrode is connected to the cathode of the schottky diode 506, and the collector electrode is connected to the emitter electrode of the transistor 510. The base electrode of the transistor 508 is supplied with the input signal which is input through the input terminal 400 of the driver circuit 306 and of which the input voltage is decreased by the transistor 401 and the schottky diode 402. The schottky diode 506 is connected at the cathode to the emitter electrode of the transistor 508, and connected at the anode to the last transistor 504. The transistors 504 decrease the positive power supply voltage (Vcc), and supply the decreased voltage to the anode of the schottky diode 506. The transistors 504 are NPN transistors. The transistors 504 are connected to one another in series between the constant current source 502 and the anode of the schottky diode 506. The first transistor 504 is connected at the base and collector electrodes to the constant current source 502, and connected at the emitter electrode to the base and collector electrodes of the next transistor 504. The last transistor 504 is connected at the base and collector electrodes to the emitter electrode of the previous transistor 504, and connected at the emitter electrode to the anode of the schottky diode 506. The transistor 510 is connected at the base electrode to the output terminal 528, the emitter electrode of the last transistor 518, the cathode of the schottky diode 524, and the base and collector electrodes of the transistor 520. The transistor 510 is connected at the emitter electrode to the collector electrode of the transistor 508, and connected at the collector electrode to the negative power supply voltage (Vee). In the present embodiment, the number of the transistors 504 connected in series is eleven. However, it is obviously possible to adjust the voltage decrease freely by changing the number of the transistors 504.

The constant current source 502 is connected to and provided between the positive power supply voltage and the transistors 504. The constant current source 502 causes a constant current to flow, between the positive power supply voltage and the negative power supply voltage, to the transistors 504, the schottky diode 506, the transistor 508, and the transistor 510.

The transistor 514 is an NPN transistor. The base electrode of the transistor 514 is connected to the input terminal 500, the emitter electrode is connected to the anode of the schottky diode 516, and the collector electrode is connected to the emitter electrode of the transistor 512. The base electrode of the transistor 514 is supplied with the input signal that is input through the input terminal 400 of the driver circuit 306 and of which the input voltage is decreased by the transistor 401 and the schottky diode 402. The schottky diode 516 is connected at the anode to the emitter electrode of the transistor 514, and connected at the cathode to the base and collector electrodes of the first transistor 518. The transistors 518 outputs a voltage obtained by decreasing the input voltage of the input signal that is input through the input terminal 400 of the driver circuit 306 by a first predetermined voltage, through the output terminal 530 to the transistor 434 as the base voltage. The decreased voltage is larger than a predetermined constant voltage. The transistors 518 are NPN transistors. The transistors 518 are connected to one another in series between the cathode of the schottky diode 516 and the constant current source 522.

The first transistor 518 is connected at the base and collector electrodes to the cathode of the schottky diode 516, and connected at the emitter electrode to the base and collector electrodes of the next transistor 518. The last transistor 518 is connected at the base and collector electrodes to the emitter electrode of the previous transistor 518, and connected at the emitter electrode to the base electrode of the transistor 510, the base and collector electrodes of the transistor 520, the cathode of the schottky diode 524, and the output terminal 528. In the present embodiment, the number of the transistors 518 connected in series is thirteen. However, it is obviously possible to adjust the first predetermined voltage freely by changing the number of the transistors 518.

The transistor 520 is connected at the base and collector electrodes to the base electrode of the transistor 510, the emitter electrode of the last transistor 518, the cathode of the schottky diode 524, and the output terminal 528, and connected at the emitter electrode to the output terminal 530 and the constant current source 522. The constant current source 522 is connected to and provided between the transistors 518 and the negative power supply voltage. The constant current source 522 causes a constant current to flow into the transistor 512, the transistor 514, the schottky diode 516, the transistors 518, and the transistor 520.

When the input voltage of the input signal input through the input terminal 400 is smaller than a first reference level, the constant voltage source 526 outputs a predetermined constant voltage to the transistor 434 as the base voltage, through the output terminal 530. In the present embodiment, the constant voltage source 526 is connected to the anode of the schottky diode 524. The constant voltage output through the output terminal 530 is obtained by decreasing the voltage generated by the constant voltage source 526, by a voltage decrease due to the schottky diode 524 and a voltage decrease due to the transistor 520. Also, the constant voltage source 526 outputs a voltage, through the output terminal 528, which is obtained by decreasing the voltage generated by the constant voltage source 526 by the voltage decrease due to the schottky diode 524. When the input voltage is smaller than the first reference level, the constant voltage source 526 outputs the constant voltage as the base voltage of the transistor 434 as mentioned above. This constant voltage may preferably has a level that does not damage the high-frequency characteristics of the basic components of the buffer circuit including the transistor 401, the schottky diode 402, the schottky diode 408, the transistor 410, the transistor 426, the schottky diode 428, the schottky diode 430 and the transistor 432.

Figure 6:
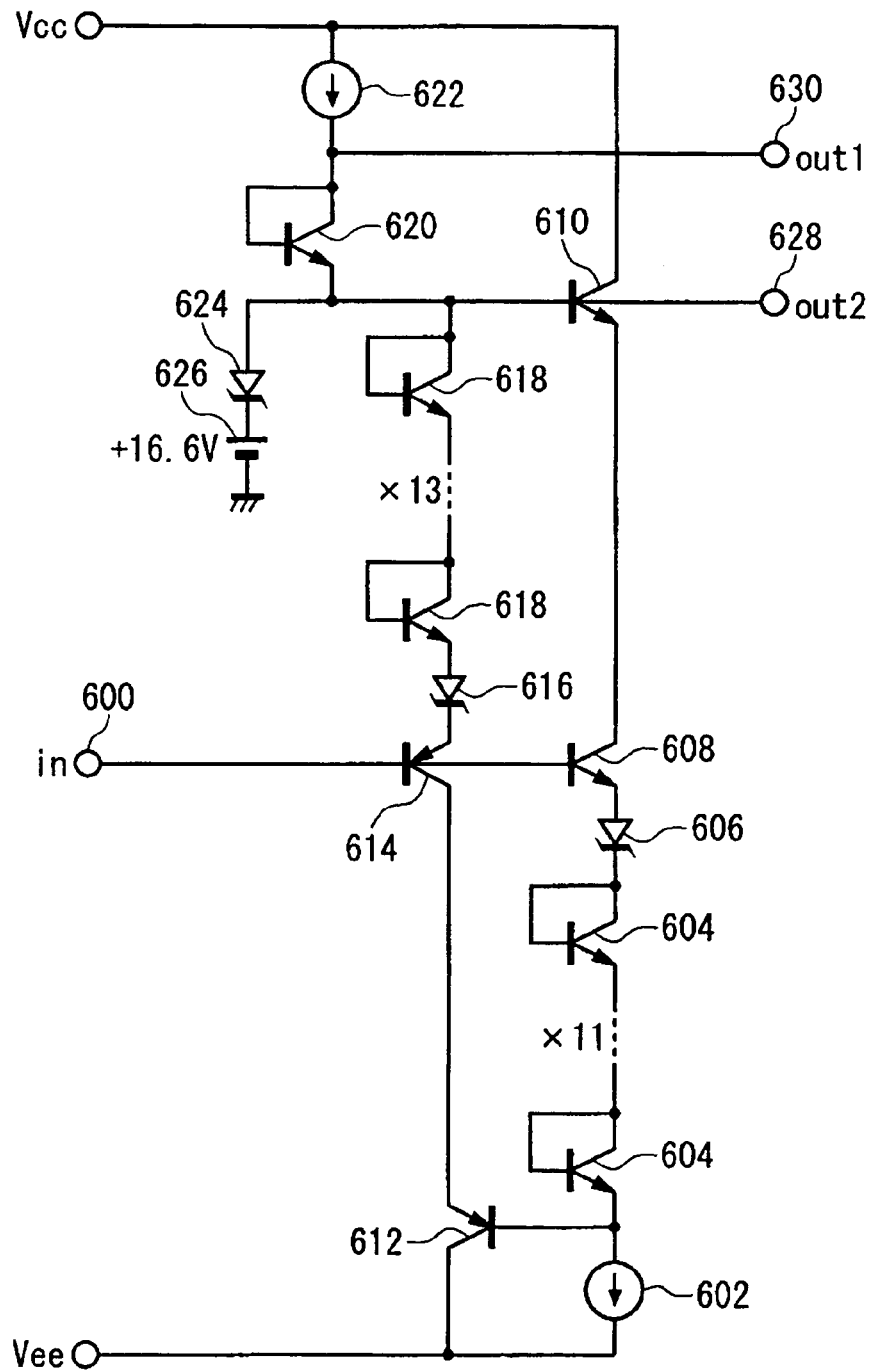
FIG. 6 shows an example of the configuration of a control circuit 422.

FIG. 6 shows an example of the configuration of the control circuit 422 in accordance with the present embodiment. The control circuit 422 includes an input terminal (in) 600, a constant current source 602, one or more transistors 604, a schottky diode 606, a transistor 608, a transistor 610, a transistor 612, a transistor 614, a schottky diode 616, one or more transistors 618, a transistor 620, a constant current source 622, a schottky diode 624, a constant voltage source 626, an output terminal (out 1) 630, and an output terminal (out 2) 628.

The control circuit 422 is illustrative of the second control circuit in accordance with the present invention. The present invention may use different circuit configurations than the control circuit 422 to realize the second control circuit. The transistors 604 and 618 are illustrative of the voltage decreasing circuit in accordance with the present invention. The present invention may use different types of elements than transistors to realize the voltage decreasing circuit.

The transistor 608 is an NPN transistor. The base electrode of the transistor 608 is connected to the input terminal 600, the emitter electrode is connected to the anode of the schottky diode 606, and the collector electrode is connected to the emitter electrode of the transistor 610. The base electrode of the transistor 608 is supplied with the input signal which is input through the input terminal 400 of the driver circuit 306 and of which the input voltage is increased by the transistor 410 and the schottky diode 408. The schottky diode 606 is connected at the anode to the emitter electrode of the transistor 608, and connected at the cathode to the last transistor 604. The transistors 604 are NPN transistors, and connected to one another in series between the constant current source 602 and the schottky diode 606. The last transistor 604 is connected at the base and collector electrodes to the cathode of the schottky diode 606, and connected at the emitter electrode to the base and collector electrodes of the previous transistor 604. The first transistor 604 is connected at the base and collector electrodes to the emitter electrode of the next transistor 604, and connected at the emitter electrode to the constant current source 602. The transistor 610 is connected at the base electrode to the output terminal 628, the base and collector electrodes of the last transistor 618, the anode of the schottky diode 624, and the emitter electrode of the transistor 620, connected at the emitter electrode to the collector electrode of the transistor 608, and connected at the collector electrode to the positive power supply voltage (Vcc). In the present embodiment, the number of the transistors 604 connected in series is eleven. However, it is obviously possible to adjust the voltage increase freely by changing the number of the transistors 604.

The constant current source 602 is connected to and provided between the negative power supply voltage (Vee) and the transistors 604. The constant current source 602 causes a constant current to flow, between the positive power supply voltage and the negative power supply voltage, into the transistors 604, the schottky diode 606, the transistor 608, and the transistor 610.

The transistor 614 is a PNP transistor. The base electrode of the transistor 614 is connected to the input terminal 600, the emitter electrode is connected to the cathode of the schottky diode 616, and the collector electrode is connected to the emitter electrode of the transistor 612. The base electrode of the transistor 614 is supplied with the input signal which is input through the input terminal 400 of the driver circuit 306, and of which the input voltage is increased by the transistor 410 and the schottky diode 408. The schottky diode 616 is connected at the cathode to the emitter electrode of the transistor 614, and connected at the anode to the emitter electrode of the first transistor 618. The transistors 618 output a voltage obtained by increasing the input voltage of the input signal input through the input terminal 400 of the driver circuit 306 by a second predetermined voltage, to the transistor 424 as the base voltage through the output terminal 630. The increased voltage is smaller than a predetermined constant voltage. The transistors 618 are NPN transistors, and connected to one another in series between the anode of the schottky diode 616 and the constant current source 622. The first transistor 618 is connected at the emitter electrode to the anode of the schottky diode 616, and connected at the base and collector electrodes to the emitter electrode of the next transistor 618. The last transistor 618 is connected at the emitter electrode to the base and collector electrodes of the previous transistor 618, and connected at the base and collector electrodes to the base electrode of the transistor 610, the emitter electrode of the transistor 620, the anode of the schottky diode 624, and the output terminal 628. In the present embodiment, the number of the transistors 618 connected in series is thirteen. However, it is obviously possible to adjust the second predetermined voltage freely by changing the number of the transistors 618.

The transistor 620 is connected at the emitter electrode to the base electrode of the transistors 610, the base and collector electrodes of the last transistor 618, the anode of the schottky diode 624, and the output terminal 628, and connected at the base and collector electrodes to the output terminal 630 and the constant current source 622. The constant current source 622 is connected to and provided between the transistors 618 and the positive power supply voltage. The constant current source 622 causes a constant current to flow into the transistor 612, the transistor 614, the schottky diode 616, the transistors 618, and the transistor 620.

When the input voltage of the input signal input through the input terminal 400 is larger than the second reference level, the constant voltage source 626 outputs a predetermined constant voltage through the output terminal 630 to the transistor 424 as the base voltage. In the present embodiment, the constant voltage source 626 is connected to the cathode of the schottky diode 624. The constant voltage output through the output terminal 630 is obtained by increasing the voltage generated by the constant voltage source 626 by a voltage increase due to the schottky diode 624 and a voltage increase due to the transistor 620. The constant voltage source 626 also outputs a voltage, through the output terminal 628, which is obtained by increasing the voltage generated by the constant voltage source 626 by the voltage increase due to the schottky diode 624.

Figure 7:
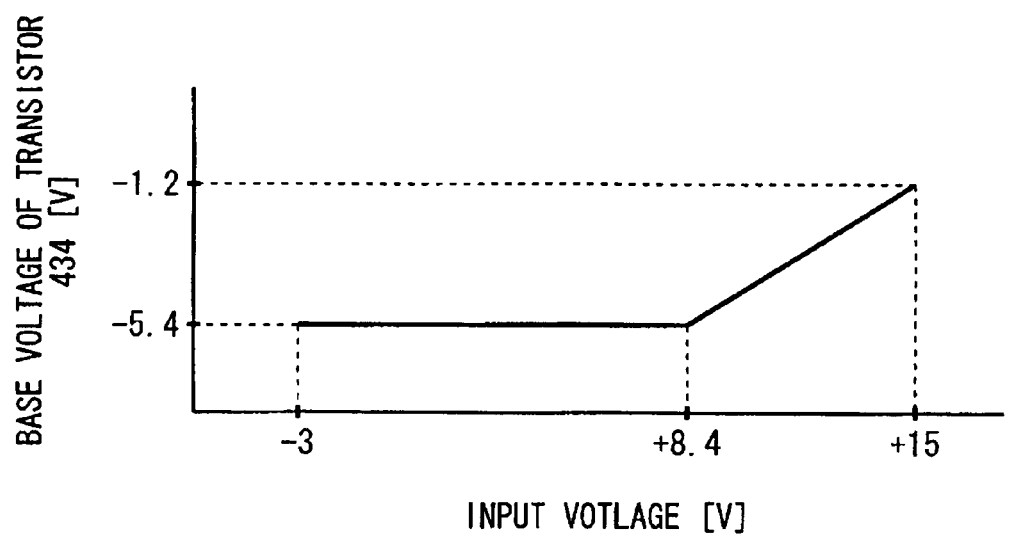
FIG. 7 shows an example of a transition of a base voltage of a transistor 434.

FIG. 7 shows an example of the transition of the base voltage of the transistor 434 in accordance with the present embodiment. In FIG. 7, the horizontal axis represents the input voltage of the input signal input through the input terminal 400, and the vertical axis represents the base voltage of the transistor 434 which is output through the output terminal (out 2) 530 of the control circuit 420 to be supplied to the transistor 434. It is assumed that in the driver circuit 306 illustrated by FIGS. 4 to 6 the positive power supply voltage is +19 V, the negative power supply voltage is −6.5 V, the input signal (input) and output signal (output) have a voltage ranging from −3 V to +15 V, the voltage decrease due to the transistors is 0.8 V, the voltage decrease due to the schottky diodes is 0.5 V, and the constant voltage source 526 is −4.1 V.

When the input voltage of the input signal is smaller than +8.4 V which is the first reference level, the base voltage to be supplied from the control circuit 420 to the transistor 434 is −5.4 V which is the predetermined constant voltage. When the input voltage of the input signal is equal to or larger than +8.4 V of the first reference level, the base voltage to be supplied from the control circuit 420 to the transistor 434 is larger than −5.4 V of the predetermined constant voltage. As explained above, the constant voltage source 526 is provided so as to maintain the base voltage of the transistor 434 at a constant level when the input voltage of the input signal is smaller than the first reference level. Accordingly, the control circuit 420 does not need to operate to cope with the change of the input voltage, thereby enabling the driver circuit 306 to operate at high speed. As stated above, when the input voltage is smaller than the first reference level, a voltage of constant level is supplied from the constant voltage source 526 to the transistor 434 as the base voltage, and when the input voltage is equal to or larger than the first reference level, the input voltage is decreased by the transistors 518 and then supplied to the transistor 434 as the base voltage. According to this construction, the voltage swing of the input signal is not directly reflected in the base-collector voltage of the transistor 434. As a result, the voltage swing of the input and output signals can be increased with the permissible level of the voltage supplied to the transistor 434 being satisfied.

Figure 8:
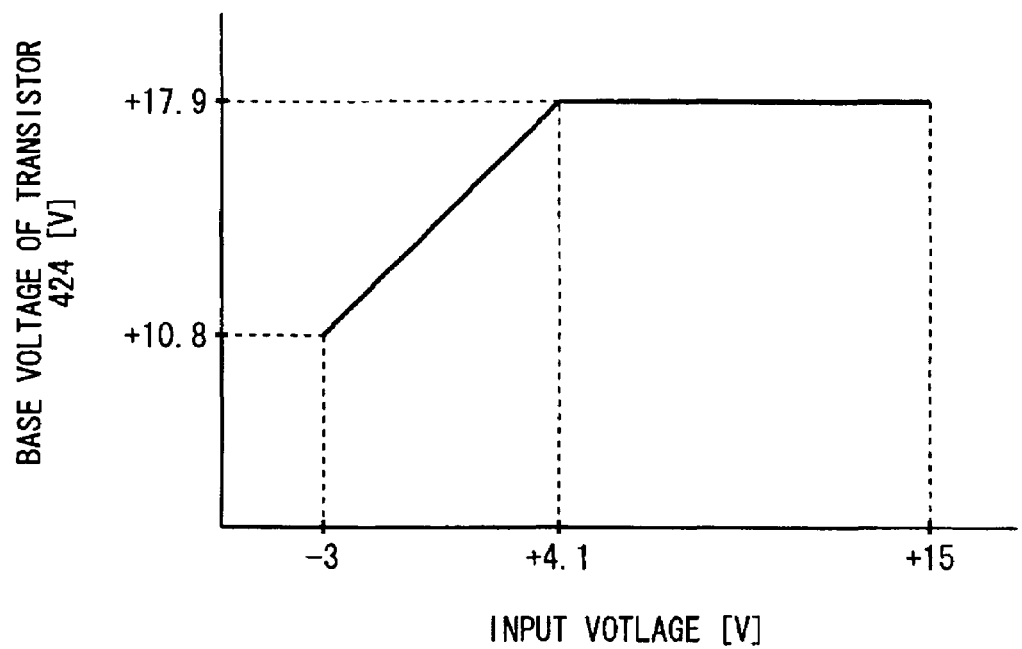
FIG. 8 shows an example of a transition of a base voltage of a transistor 424.

FIG. 8 shows an example of the transition of the base voltage of the transistor 424 in accordance with the present embodiment. In FIG. 8, the horizontal axis represents the input voltage of the input signal that is input through the input terminal 400, and the vertical axis represents the base voltage of the transistor 424 which is output through the output terminal (out 1) 630 of the control circuit 422 to be supplied to the transistor 424. It is assumed that in the driver circuit 306 illustrated by FIGS. 4 to 6 the positive power supply voltage is +19 V, the negative power supply voltage is −6.5 V, the input signal (input) and output signal (output) have a voltage ranging from −3 V to +15 V, the voltage decrease due to the transistors is 0.8 V, the voltage decrease due to the schottky diodes is 0.5 V and the constant voltage source 626 is +16.6 V.

When the input voltage of the input signal is larger than +4.1 V which is the second reference level, the base voltage to be supplied from the control circuit 422 to the transistor 424 is +17.9 V which is the predetermined constant voltage. When the input voltage of the input signal is equal to or smaller than +4.1 V of the second reference level, the base voltage to be supplied from the control circuit 422 to the transistor 424 is smaller than +17.9 V of the predetermined constant voltage. As explained above, the constant voltage source 626 is provided so as to maintain the base voltage of the transistor 424 at a constant level when the input voltage of the input signal is larger than the second reference level. Accordingly, the control circuit 422 does not need to operate to cope with the change in the input voltage. As stated above, when the input voltage is larger than the second reference level, a voltage of constant level is supplied from the constant voltage source 626 to the transistor 424 as the base voltage, and when the input voltage is equal to or smaller than the second reference level, the input voltage is increased by the transistors 618 and then supplied to the transistor 424 as the base voltage. According to this construction, the voltage swing of the input signal is not directly reflected in the base-collector voltage of the transistor 424. As a result, the voltage swing of the input and output signals can be increased with the permissible level of the voltage supplied to the transistor 424 being satisfied.

As for the driver circuit 306 illustrated by FIGS. 4 to 8, as shown in FIG. 4, the base voltage of the transistors 412 and 414 falls in a range of +10 V to +17.1 V, the base voltage of the transistors 416 and 418 falls in a range of −4.6 V to +2 V, the base voltage of the transistor 424 falls in a range of +10.8 V to +17.9 V, the base voltage of the transistor 426 falls in a range of −1.7 V to +16.3 V, the base voltage of the transistor 432 falls in a range of −4.3 V to +13.7 V, and the base voltage of the transistor 434 falls in a range of −5.4 V to +1.2 V. By providing the tracking circuit including the control circuits 420 and 422, the base voltage can be dispersed between the transistors 424, 426, 432 and 434. This allows the input and output voltages to have a large voltage swing. As a consequence, the driver circuit 306 in accordance with the present embodiment can appropriately deal with input and output signals with a large voltage swing.

While the present invention has been described with the embodiment, the technical scope of the invention is not limited to the above described embodiment. It is apparent to persons skilled in the art that various alternations and improvements can be added to the above-described embodiment. It is apparent from the scope of the claims that the embodiment added with such alternations or improvements can be included in the technical scope of the invention.

What is claimed is:

1. A buffer circuit for outputting an output signal corresponding to an input signal, comprising:
    an input/output circuit for maintaining an output impedance at a constant level, and outputting the output signal having an output voltage which is substantially same as an input voltage of the input signal;
    a first transistor and a second transistor that are connected to respective ends of the input/output circuit in series, the first and second transistors protecting the input/output circuit by reducing power consumption of the input/output circuit in such a manner as to supply voltages that correspond to the input voltage or the output voltage in terms of level, to the respective ends of the input/output circuit; and
    a first control circuit for (i) when the input voltage is smaller than a first reference level, supplying a predetermined constant voltage to the first transistor as a base voltage thereof, and (ii) when the input voltage is equal to or larger than the first reference level, supplying a voltage that is obtained by decreasing the input voltage by a first predetermined voltage to the first transistor as the base voltage, the decreased voltage being larger than the predetermined constant voltage.

2. The buffer circuit according to claim 1, wherein the input/output circuit includes:
    an input terminal for receiving the input signal;
    an output terminal for outputting the output signal;
    a third transistor whose base electrode is connected to the input terminal, and whose collector electrode is connected to a positive power supply voltage, the third transistor being an NPN transistor;
    a first diode whose anode is connected to an emitter electrode of the third transistor;
    a first constant current source that is connected to a cathode of the first diode, the first constant current source supplying a constant current to the third transistor and the first diode;
    a fourth transistor whose base electrode is connected to the input terminal, and whose collector electrode is connected to a negative power supply voltage, the fourth transistor being a PNP transistor;
    a second diode whose cathode is connected to an emitter electrode of the fourth transistor; and
    a second constant current source that is connected to an anode of the second diode, the second constant current source supplying a constant current to the fourth transistor and the second diode.

3. The buffer circuit according to claim 2, wherein the input/output circuit further includes:
    a fifth transistor whose base electrode is connected to the cathode of the first diode, and whose collector electrode is connected to an emitter electrode of the first transistor, the fifth transistor being a PNP transistor;
    a third diode whose anode is connected to the output terminal, and whose cathode is connected to an emitter electrode of the fifth transistor;
    a sixth transistor whose base electrode is connected to the anode of the second diode, and whose collector electrode is connected to an emitter electrode of the second transistor, the sixth transistor being an NPN transistor; and a fourth diode whose anode is connected to an emitter electrode of the sixth transistor, and whose cathode is connected to the output terminal.

4. The buffer circuit according to claim 1, wherein the first transistor is a PNP transistor, and a collector electrode and an emitter electrode of the first transistor are respectively connected to a negative power supply voltage and the input/output circuit, and the second transistor is an NPN transistor, and a collector electrode and an emitter electrode of the second transistor are respectively connected to a positive power supply voltage and the input/output circuit.

5. The buffer circuit according to claim 1, wherein the first control circuit includes a first constant voltage source for, when the input voltage is smaller than the first reference level, supplying the predetermined constant voltage to the first transistor as the base voltage thereof.

6. The buffer circuit according to claim 1, wherein the first control circuit includes:

a seventh transistor whose base electrode is supplied with the input signal, the seventh transistor being a PNP transistor;

a fifth diode whose cathode is connected to an emitter electrode of the seventh transistor;

a first voltage decreasing circuit for decreasing a positive power supply voltage and supplying the decreased voltage to an anode of the fifth diode;

a third constant current source that is connected to the positive power supply voltage and the first voltage decreasing circuit so as to be positioned therebetween, the third constant current source supplying a constant current to the first voltage decreasing circuit, the fifth diode, and the seventh transistor;

an eighth transistor whose base electrode is supplied with the input signal, the eighth transistor being an NPN transistor;

a sixth diode whose anode is connected to an emitter electrode of the eighth transistor;

a second voltage decreasing circuit that is connected to a cathode of the sixth diode, the second voltage decreasing circuit supplying the voltage obtained by decreasing the input voltage by the first predetermined voltage, to the first transistor as the base voltage, the decreased voltage being larger than the predetermined constant voltage; and a fourth constant current source that is connected to the second voltage decreasing circuit and a negative power supply voltage so as to be positioned therebetween, the fourth constant current source supplying a constant current to the eighth transistor, the sixth diode, and the second voltage decreasing circuit.

7. The buffer circuit according to claim 1, further comprising a second control circuit for (i) when the input voltage is larger than a second reference level, supplying a predetermined constant voltage to the second transistor as a base voltage thereof, and (ii) when the input voltage is equal to or smaller than the second reference level, supplying a voltage obtained by increasing the input voltage by a second predetermined voltage, to the second transistor as the base voltage, the increased voltage being smaller than the predetermined constant voltage.

8. The buffer circuit according to claim 7, wherein the second control circuit includes a second constant voltage source for, when the input voltage is larger than the second reference level, supplying the predetermined constant voltage to the second transistor as the base voltage.

9. The buffer circuit according to claim 7, wherein the second control circuit includes:

a ninth transistor whose base electrode is supplied with the input signal, the ninth transistor being an NPN transistor;

a seventh diode whose anode is connected to an emitter electrode of the ninth transistor;

a third voltage decreasing circuit for increasing a negative power supply voltage and supplying the increased voltage to a cathode of the seventh diode;

a fifth constant current source that is connected to the negative power supply voltage and the third voltage decreasing circuit so as to be positioned therebetween, the fifth constant current source supplying a constant current to the third voltage decreasing circuit, the seventh diode, and the ninth transistor;

a tenth transistor whose base electrode is supplied with the input signal, the tenth transistor being a PNP transistor;

an eighth diode whose cathode is connected to an emitter electrode of the tenth transistor;

a fourth voltage decreasing circuit that is connected to an anode of the eighth diode, the fourth voltage decreasing circuit supplying the voltage obtained by increasing the input voltage by the second predetermined voltage, to the second transistor as the base voltage, the increased voltage being smaller than the predetermined constant voltage; and a sixth constant current source that is connected to the fourth voltage decreasing circuit and a positive power supply voltage so as to be positioned therebetween, the sixth constant current source supplying a constant current to the tenth transistor, the eighth diode, and the fourth voltage decreasing circuit.

10. A buffer circuit for outputting an output signal corresponding to an input signal, comprising:

an input/output circuit for maintaining an output impedance at a constant level, and outputting the output signal having an output voltage which is substantially same as an input voltage of the input signal;

a first transistor and a second transistor that are connected to respective ends of the input/output circuit in series, the first and second transistors protecting the input/output circuit by reducing power consumption of the input/output circuit in such a manner as to supply voltages that correspond to the input voltage or the output voltage in terms of level, to the respective ends; and a second control circuit for (i) when the input voltage is larger than a second reference level, supplying a predetermined constant voltage to the second transistor as a base voltage thereof, and (ii) when the input voltage is equal to or smaller than the second reference level, supplying a voltage obtained by increasing the input voltage by a second predetermined voltage to the second transistor as the base voltage, the increased voltage being smaller than the predetermined constant voltage.

11. A driver circuit for supplying a test signal to a semiconductor device, comprising:

an input/output circuit for maintaining an output impedance at a constant level, and supplying the test signal which has an output voltage substantially same as an input voltage of an input test signal, to the semiconductor device;
a first transistor and a second transistor that are connected to respective ends of the input/output circuit in series, the first and second transistors protecting the input/output circuit by reducing power consumption of the input/output circuit in such a manner as to supply voltages that correspond to the input voltage or the output voltage in terms of level, to the respective ends; and
a first control circuit for (i) when the input voltage is smaller than a first reference level, supplying a predetermined constant voltage to the first transistor as a base voltage thereof, and (ii) when the input voltage is equal to or larger than the first reference level, supplying a voltage obtained by decreasing the input voltage by a first predetermined voltage, to the first transistor as the base voltage, the decreased voltage being larger than the predetermined constant voltage.

12. A semiconductor testing apparatus for testing a semiconductor device, comprising:
a pattern generating section for generating a test signal to be input into the semiconductor device;
a driver circuit for supplying the test signal to the semiconductor device;
a comparator circuit for comparing a test signal output from the semiconductor device with a threshold voltage; and
a judging section for judging whether the semiconductor device is good or bad based on a result of the comparison done by the comparator circuit, wherein
the driver circuit includes:
an input/output circuit for maintaining an output impedance at a constant level, and supplying a test signal having an output voltage which is substantially same as an input voltage of the test signal, to the semiconductor device;
a first transistor and a second transistor that are connected to respective ends of the input/output circuit in series, the first and second transistors protecting the input/output circuit by reducing power consumption of the input/output circuit in such a manner as to supply voltages that correspond to the input voltage or the output voltage in terms of level, to the respective ends of the input/output circuit; and
a first control circuit for (i) when the input voltage is smaller than a first reference level, supplying a predetermined constant voltage to the first transistor as a base voltage thereof, and (ii) when the input voltage is equal to or larger than the first reference level, supplying a voltage that is obtained by decreasing the input voltage by a first predetermined voltage to the first transistor as the base voltage, the decreased voltage being larger than the predetermined constant voltage.

* * * * *